United States Patent [19]
Kakuta et al.

[11] Patent Number: 6,011,438
[45] Date of Patent: Jan. 4, 2000

[54] PUSH-PULL WIDEBAND SEMICONDUCTOR AMPLIFIER

[75] Inventors: Yuji Kakuta; Yoshiaki Fukasawa; Yuichi Taguchi, all of Tokyo, Japan

[73] Assignee: NEC Corporation, Tokyo, Japan

[21] Appl. No.: 09/195,408

[22] Filed: Nov. 19, 1998

[30] Foreign Application Priority Data

Nov. 27, 1997 [JP] Japan ................................. 9-326443

[51] Int. Cl.[7] ...................................................... H03F 3/26
[52] U.S. Cl. ............................................ 330/262; 330/271
[58] Field of Search .................................. 330/262, 271, 330/272, 276, 311

[56] References Cited

U.S. PATENT DOCUMENTS

| | | | |
|---|---|---|---|
| 4,112,386 | 9/1978 | Everhart et al. | 330/262 |
| 4,706,038 | 11/1987 | Navidi et al. | 330/271 |
| 4,965,526 | 10/1990 | Craft et al. | 330/295 |
| 5,142,239 | 8/1992 | Brayton et al. | 330/276 |
| 5,477,188 | 12/1995 | Chawla et al. | 330/272 |
| 5,742,205 | 4/1998 | Cowen et al. | 330/271 |

*Primary Examiner*—Robert Pascal
*Assistant Examiner*—Khanh Van Nguyen

*Attorney, Agent, or Firm*—Sughrue, Mion, Zinn, Macpeak & Seas, PLLC

[57] ABSTRACT

A push-pull wideband semiconductor amplifier for use in, for example, a CATV (cable television) system. The amplifier suppresses deterioration of composite second-order (CSO) distortion in output signals. The push-pull wideband amplifier includes: a divider which divides a signal inputted by way of an input terminal into two signals of differing phase, first and second amplifying circuits each of which amplifies the signal divided by the divider, and a combiner which combines the two signals amplified by the first and second amplifying circuits into one signal and outputs the result signal. The node between the first amplifying circuit and the second amplifying circuit is an imaginary ground point having a potential of 0 V from the standpoint of an alternating-current signal. A termination circuit is provided between this imaginary ground, point and ground and absorbs fluctuation in potential generated at the imaginary ground point. In the event of fluctuation in potential generated at the imaginary ground point, the fluctuation in potential is absorbed by the termination circuit. The standing wave that accompanies fluctuation in potential is therefore not generated, and even-order distortion is suppressed.

11 Claims, 3 Drawing Sheets

PUSH-PULL WIDEBAND SEMICONDUCTOR AMPLIFIER

BACKGROUND OF THE INVENTION

1. Field of the Invention

The present invention relates to a semiconductor circuit, and particularly to a push-pull wideband amplifier used to amplify signals in, for example, CATV (Cable Television) systems.

2. Description of the Related Art

Such fields as CATV (cable television) require wideband amplifiers that amplify signals across a broad frequency bandwidth. Wideband amplifiers for CATV systems are generally configured as HICs (hybrid integrated circuits).

The push-pull type is one circuit configuration of a wideband amplifier. The hybrid push-pull wideband amplifier described in Japanese Patent Laid-open No. 52407/91 (JP, 03052407, A) is one example of an HIC wideband amplifier for a CATV system. FIG. 1 is a circuit diagram showing the configuration of the push-pull wideband amplifier described in JP 03052407, A.

This wideband amplifier is constructed with two amplifying circuit units 140 and 150 which operate in a mutual push-pull relation. The two amplifying circuit units 140 and 150 are both cascade amplifying circuits, are mutually connected, and have essentially the same internal circuit configurations. The first amplifying circuit unit 140 is made up of resistors R141 to R145, capacitors C141 and C142, and transistors Tr141 and Tr142; and the second amplifying circuit unit 150 is made up of resistors R151 to R155, capacitors C151 and C152, and transistors Tr151 and Tr152. Capacitor C164 is an RF (radio frequency) bias capacitor, and resistor R164 and capacitor C163 are optional. Resistor R161 and capacitor C162 provided between amplifying circuit units 140 and 150 receive the effect of an imaginary grounding, and serve as a means of independently controlling the AC (alternating-current) emitter impedance of transistors Tr141 and Tr151.

In a circuit configured according to the foregoing description, input signals are supplied to each of amplifying circuit units 140 and 150 in push-pull mode by RF input transformer T161, and the signals amplified by amplifying circuit units 140 and 150 are extracted by way of RF transformer T162.

The DC (direct-current) power supply ($V_{cc}$) is supplied to each of amplifying circuit units 140 and 150 by way of resistors R162 and R163 and RF output transformer T162. Output shunt capacitor C165 is optional, but assists in controlling high-frequency gain and output impedance of the circuit.

Owing to their excellent high-frequency characteristics, bipolar transistors are typically used for transistors Tr141, Tr142, Tr151, and Tr152, which are the amplifying means, but other types of components for RF amplifications, ICs, or subassemblies may be used.

Finally, optional capacitors (not shown) between a ground point and the bases of transistors Tr141 and Tr151 are provided to assist matching of input impedance.

Although a CATV HIC wideband amplifier having a push-pull circuit generally gives rise to composite second-order (CSO) distortion, the above-described semiconductor circuit of the prior art does not include a circuit for compensating CSO, CSO deterioration being suppressed merely by the balance of the elements and electrical characteristics of each of the push-pull circuits.

Although such methods as adjusting the windings of the transformer or adjusting the balance between each port of the transformer can be considered as methods of compensating CSO in the circuit shown in FIG. 1, these methods are not amenable to automation and entail extra time and trouble, resulting in higher costs. In addition, the circuit constants of resistor R162 and capacitor C163 along with resistor R163 and capacitor C164 are determined by bias conditions alone and are not selected by high-frequency termination characteristics. The resistances of the resistors therefore vary widely according to the bias constants of the transformers. Resistance as high as, for example, 100 Ω or more results in high-frequency high impedance, while resistance as low as, for example, 10 Ω or lower results in a high-frequency short-circuited state due to capacitors C163 and C164. The contingencies for setting bias generally results in resistances of several hundred ohm or more in HIC for CATV, resulting in total reflection state in the high-frequency region.

If the push-pull circuit goes out of balance due to, for example, variation between elements, imaginary ground point (point A in the figure) only loses its grounded status, and a minute high-frequency oscillation in potential is generated at the imaginary ground point. This oscillation then becomes an oscillation source and a high-frequency current flows, but since the circuit coupled to the imaginary ground point acts as a bias circuit, the generated oscillation is totally reflected, and a progressive wave and reflected wave are generated. A standing wave is generated by this progressive wave and reflected wave, and this standing wave causes increased oscillation of the connected gate potential. This potential fluctuation is amplified, causing further deterioration of the balance of the push-pull circuit.

SUMMARY OF THE INVENTION

The present invention was achieved in view of the problems of the above-described prior art, and has the object of providing a semiconductor circuit that can compensate the deterioration of composite second-order distortion in a push-pull circuit.

The object of the present invention is achieved by a semiconductor circuit comprising: a divider which divides a signal inputted by way of an input terminal into two signals of differing phase; a first and a second amplifying circuit which respectively amplify the signals divided by the divider; a combiner which combines two signals amplified by the first and second amplifying circuits into one signal and outputs the result; an imaginary ground point which is a node between the first amplifying circuit and the second amplifying circuit and for which potential is to be 0 V from a standpoint of an alternating-current signal; and a termination circuit which is provided between ground and the imaginary ground point and absorbs the fluctuation in potential generated at the imaginary ground point.

In the present invention, an imaginary ground point exists at the connecting node between the first amplifying circuit and the second amplifying circuit at which the potential is 0 V from the standpoint of an alternating current, and a termination circuit is provided between the imaginary ground point and an actual ground point that absorbs fluctuation in potential which is generated at the imaginary ground point. Fluctuation in potential is thus absorbed by the termination circuit when fluctuation in potential occurs at the imaginary ground point. Accordingly, fluctuation in potential is not reflected and a standing wave is not generated even in the event that fluctuation in potential occurs at the imaginary ground point. Balance can thus be maintained between the first amplifying circuit and the second amplifying circuit, and the deterioration of CSO can be prevented.

The above and other objects, features, and advantages of the present invention will become apparent from the following description based on the accompanying drawings which illustrate examples of preferred embodiments of the present invention.

DESCRIPTION OF THE PREFERRED EMBODIMENTS

Figure 1:
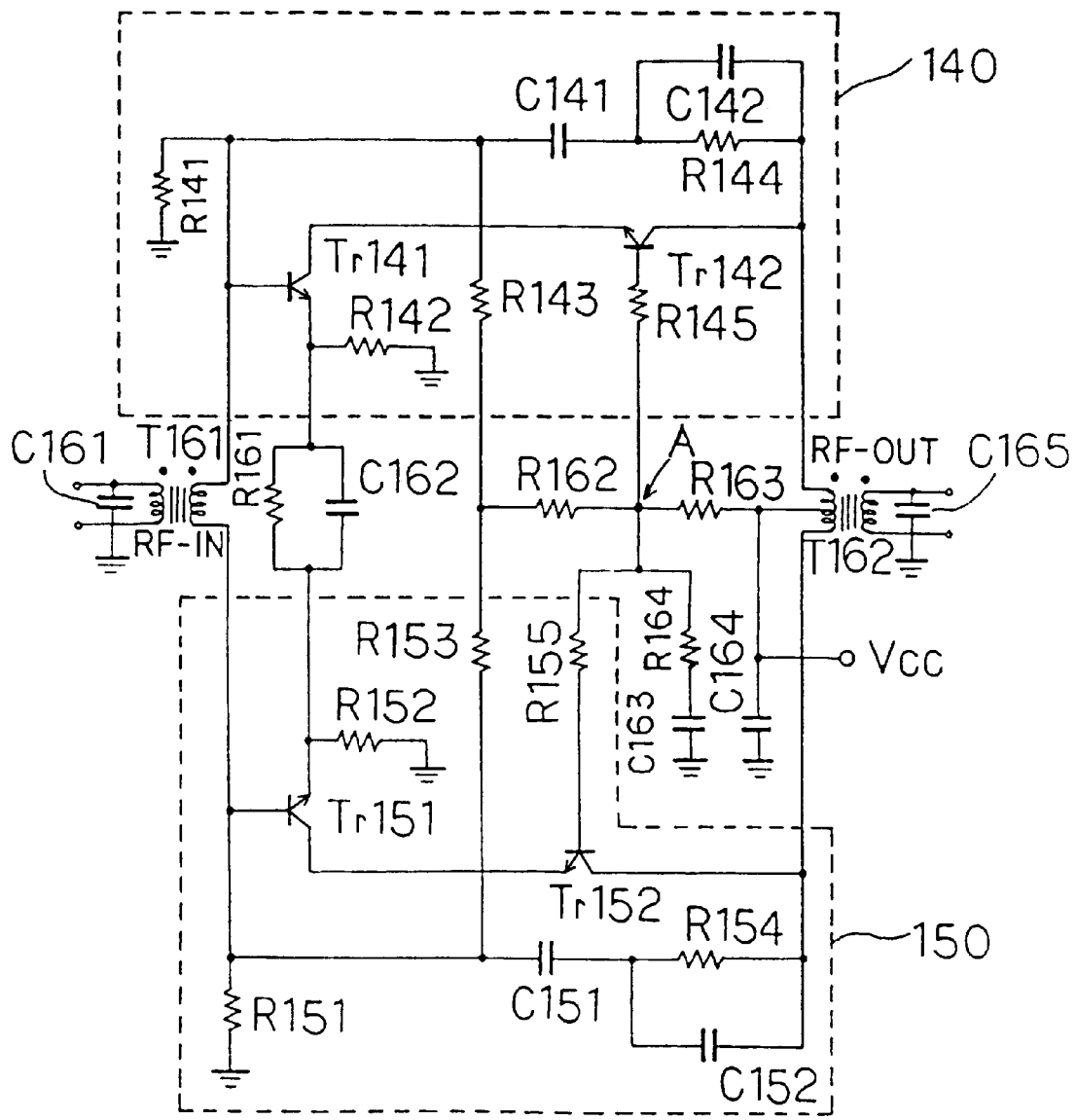
FIG. 1 is a circuit diagram showing one example of the construction of an HIC wideband amplifier for a CATV sysmtem of the prior art which employs a push-pull circuit.
Figure 2:
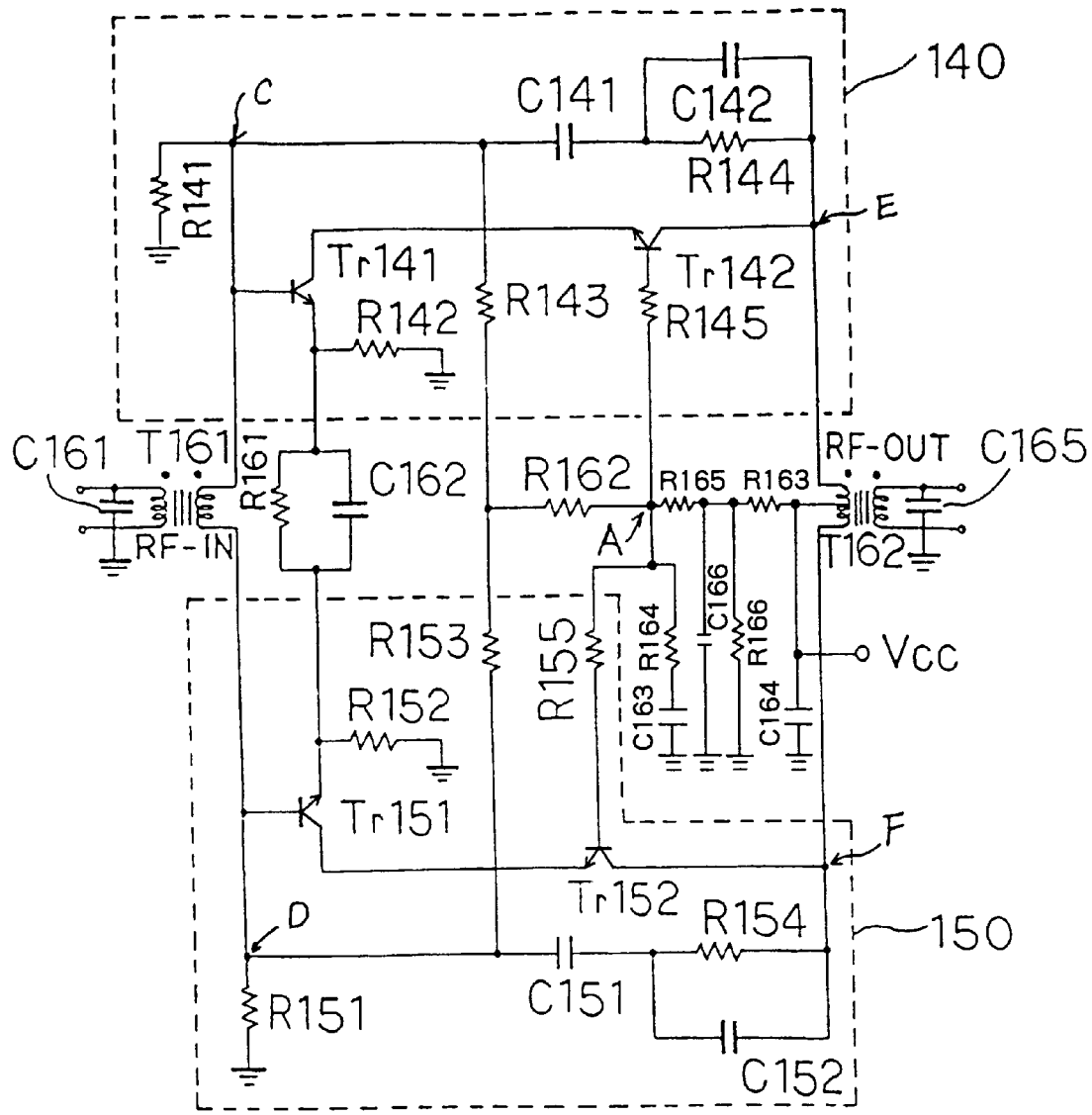
FIG. 2 is a circuit diagram showing a wideband amplifier according to the first embodiment of the present invention.

The push-pull wideband amplifier circuit according to the first embodiment of the present invention shown in FIG. 2 is constructed with two amplifying circuit units 140 and 150 which operate in a mutual push-pull relation. Each amplifying circuit unit 140 and 150 is a cascade amplifying circuit, the two circuits being connected together and the internal circuit configuration of each being essentially the same.

First amplifying circuit unit 140 includes transistor Tr141 operating as an emitter grounding circuit, and transistor Tr142 operating as a gate grounding circuit. The collector of transistor Tr141 is connected to the emitter of transistor Tr142. Resistor R141 is inserted between the base of transistor Tr141 and a ground point, and resistor R142 is inserted between the emitter of transistor Tr141 and a ground point. One end of resistor R143 is connected to the base of transistor Tr141. In addition, resistor R144 and capacitor C141 connected in series are provided between the collector of transistor Tr142 and the base of transistor Tr141, and capacitor C142 is provided in parallel with resistor R144. One end of resistor R145 is connected to the base of transistor Tr142.

Similar to first amplifying circuit unit 140, second amplifying circuit unit 150 is made up of resistors R151 to R155, capacitors C151 and C152, and transistors Tr151 and Tr152.

RF input transformer T161 is provided to divide input signals between the two amplifying circuit units 140 and 150, and capacitor C161 is provided between the input signal terminal and a ground point. Each of the two outputs of RF input transformer T161 is connected to a respective base of transistors Tr141 and Tr151. Resistor R161 and capacitor C162 connected in parallel are provided between the emitter of transistor Tr141 and the emitter of transistor Tr151. Resistor R161 and capacitor C162 receive the effect of the imaginary grounding and serve as a means of independently controlling the AC (alternating-current) emitter impedance of transistors Tr141 and Tr151.

The other end of resistor R143 and the other end of resistor R153 are connected together at the first node, and the other end of resistor R145 and the other end of resistor R155 are connected together at the second node (point A). The first node and the second node are connected by way of resistor R162. The second node, i.e., point A, is the imaginary ground point. Resistor R164 and capacitor C163 connected in series are provided between this point A and a ground point.

To extract signals amplified by amplifying circuit units 140 and 150 by way of RF output transformer T162, each of the terminal portions of the input winding of RF output transformer T162 is connected to a respective collector of transistor Tr142 and transistor Tr152. Output shunt capacitor C165 is provided between a ground point and one end of the output winding of RF output transformer T162.

Power supply voltage $V_{cc}$ is supplied both to the center tap of the input winding of RF output transformer T162 and to point A by way of resistors R163 and R165 connected in series. Capacitor C164 is provided between the input terminal of the power supply voltage and a ground point. Resistor 166 and capacitor C166 connected in parallel are provided between a ground point and the midpoint of resistor R163 and resistor R164. Resistor R163 and capacitor C164 constitute a bias circuit, and resistor R164 and capacitor C163 also constitute a bias circuit.

The resistance of resistor R165 which is connected to imaginary ground point A is set to within a range of 10 to 100 $\Omega$. This resistor R165 and capacitor C166 form a termination circuit for imaginary ground point A.

Explanation is next presented regarding the operation of the semiconductor circuit configured according to the foregoing description.

A signal inputted from the outside is first divided into two signals at transformer T161, the phase difference between the two divided signals being 180°. These two divided signals are respectively amplified at amplifying circuit units 140 and 150, following which they are combined at transformer T162 and outputted from the output terminal.

If balance is maintained between amplifying circuit units 140 and 150, signals in the above-described series of operations can be represented by the following equations. Here, coefficients up to the second order are shown. In addition, the base of transistor Tr141 is point C, the base of transistor Tr151 is point D, the collector of transistor Tr142 is point E, and the collector of transistor Tr152 is point F.

If the incident wave is $X \cos \omega t$, then the signals at point C and point D are following:

point C: $(X/2)\cos \omega t$, point D: $(X/2)\cos(\omega t - \pi)$.

If the amplification ratio at amplifying circuit units 140 and 150 is Y, the signals at the outputs of amplifying circuit units 140 and 150 are following:

point E: $(XY/2)\cos \omega t + Z \cos 2 \omega t$, point F: $(XY/2)\cos(\omega t - \pi) + Z \cos 2(\omega t - \pi)$.

Here, the second terms in the equations for the signals of point E and point F represent second-order distortion, which is the chief generation source of CSO.

The signal of point E and the signal of point F are next combined at transformer T162, and because the phase of the signal of point F is reversed 180° and then combined, then:

E+F=$(XY/2)\cos \omega t + Z \cos 2 \omega t - (XY/2)\cos(\omega t - \pi) - Z \cos 2(\omega t - \pi)$ =$XY \cos \omega t$ Accordingly, if balance is maintained between amplifying circuit units 140 and 150, i.e., if the electrical characteristics of the two amplifying circuit units 140 and 150 making up the push-pull circuit are equivalent, the waveform and amplitude of high-frequency signals flowing through the amplifying circuit units are the same, and the phase is shifted 180°, then only the base wave is outputted and second-order distortion, which is the source of CSO, is canceled and not outputted. At this time, the voltage of point A becomes 0 V from the standpoint of an AC signal, and can be seen as a grounded state. It can also be said that point A is an imaginary ground point. Put in different terms, amplifying circuit units 140 and 150 operate ideally if point A is seen as a ground point, and the even-order distortion (particularly second-order distortion) component is canceled.

In actuality, however, the balance between amplifying circuit units 140 and 150 is lost due to such factors as variation between elements. When amplifying circuit units 140 and 150 go out of balance, point A cannot be considered an AC ground, and an AC signal is generated at point A. This AC signal gives rise to oscillation in the gate potential of each transistor, and this oscillation is amplified to result in worse even-order distortion, which is not canceled in the output signal.

By configuring a termination circuit using resistor R165 and capacitor C166 in the above-described semiconductor circuit, the AC signal generated by oscillation in potential at point A is absorbed by resistor R165. A standing wave brought about by reflection of this AC signal is therefore not generated, and deterioration of the balance state caused by the standing wave, as well as degradation by CSO, does not occur.

In addition, if oscillation in potential at point A does not occur, point A, which is at the neutral point of the push-pull circuit, can be seen as forcibly grounded from the standpoint of an alternating current. Balance between amplifying circuit units 140 and 150 is thus forcibly maintained, the inherent unbalance factors included in the circuit are corrected, thereby further preventing deterioration of even-order (chiefly CSO) distortion. An improvement is thus achieved in the circuit characteristics.

Figure 3:
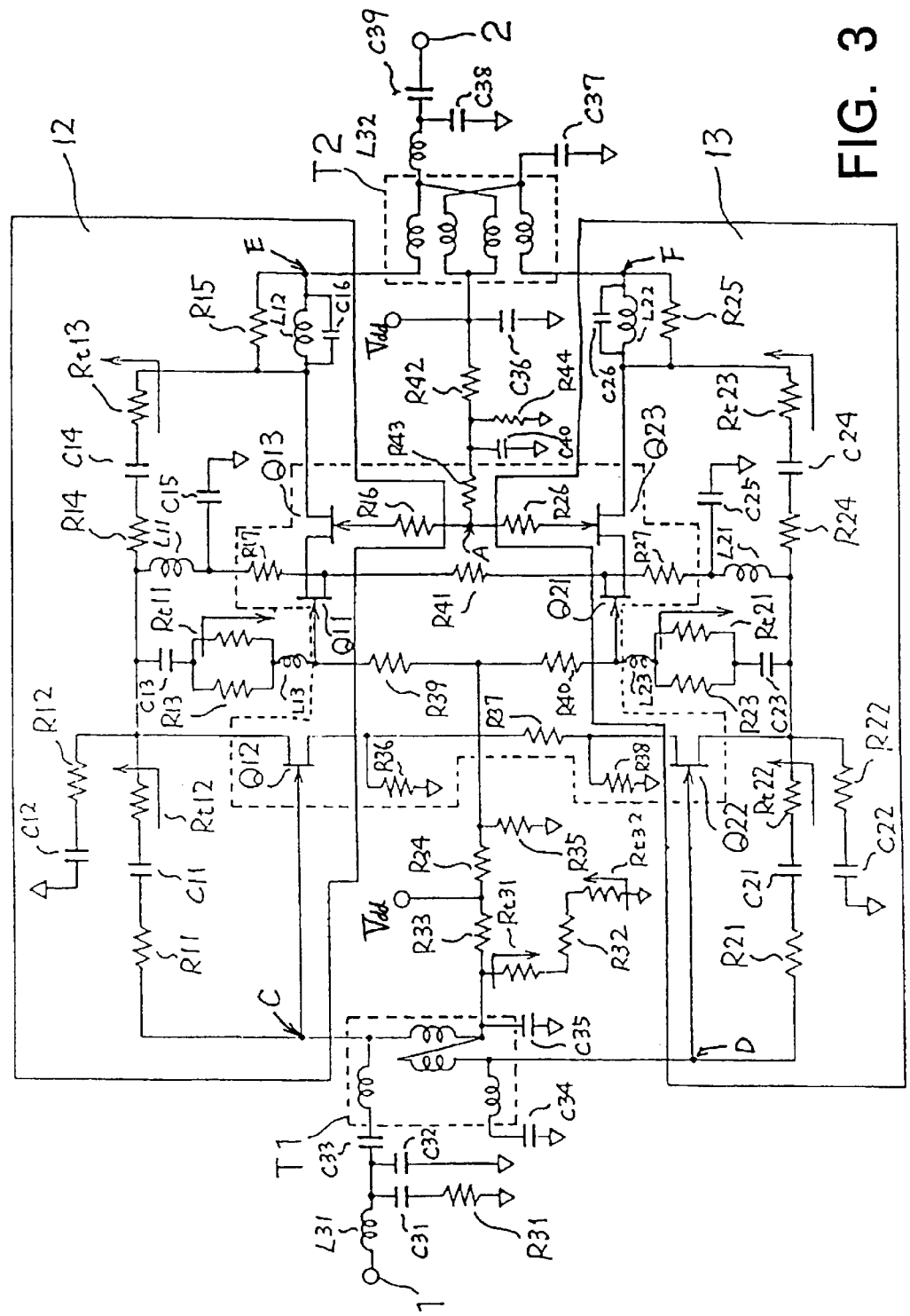
FIG. 3 is a circuit diagram showing a wideband amplifier according to the second embodiment of the present invention.

In the semiconductor circuit according to a second embodiment of the present invention shown in FIG. 3, a signal inputted to input terminal 1 is divided into two signals, the two divided signals are respectively amplified at amplifying circuits 12 and 13, and the signals amplified at amplifying circuits 12 and 13 are combined and outputted. A push-pull amplifying circuit is formed by amplifying circuits 12 and 13.

Transformer T1 grounded by way of capacitors C34 and C35 is provided as a divider that divides the signal inputted by way of input terminal 1 into two signals of differing phase. In addition, transformer T2 grounded by way of capacitor C37 is provided as a combiner that combines the two signals amplified by amplifying circuits 12 and 13 into one signal.

Amplifying circuit 12 includes FETs (field effect transistors) Q11 to Q13 connected in multiple stages. In amplifying circuit 12, thermistor Rt11 and resistor R13 connected in parallel are provided as the gate resistance of FET Q11, which is the second-stage FET, and inductor L13 is inserted between this gate resistance and the gate of FET Q11. Resistor R11, capacitor C11 and thermistor Rt12 are connected in a series between the gate and drain of FET Q12, which is the first stage of amplifying circuit 12. The drain of FET Q12 is connected to a prescribed potential point by way of resistor R12 and capacitor C12 connected in a series, and moreover, is connected to the gate resistance (i.e., thermistor Rt11 and resistor R13) of FET Q11 by way of capacitor C13, and to the source of FET Q11 by way of inductor L11 and resistor R17 connected in series. The connection point between inductor L11 and resistor R17 is connected to a prescribed potential point by way of capacitor C15.

Resistor R14, capacitor C14 and thermistor Rt13 are provided in a series between the drain of FET Q12 and the drain of FET Q13. Resistor R16 is connected to the gate of FET Q13. Resistor R15, inductor L12 and capacitor C16 are connected together in parallel and provided between the drain of FET Q13 and the output terminal of amplifying circuit 12. The source of FET Q13 is connected to the drain of FET Q11.

Amplifying circuit 13 is configured the same as amplifying circuit 12, and is provided with FETs Q21 to 23 connected in multiple stages, resistors R21 to R27, thermistors Rt21 to Rt23, capacitors C21 to C26 and inductors L21 to L24 that correspond to resistors R11 to R17, thermistors Rt11 to Rt13, capacitors C11 to C16 and inductors L11 to L14, respectively, of amplifying circuit 12. FET Q21 to Q23 correspond to FET Q11 to 13, respectively, of amplifying circuit 12.

The gate of FET Q13 of amplifying circuit 12 is connected to the gate of FET Q23 of amplifying circuit 13 by way of resistors R16 and R26.

On the input side of transformer T1, capacitor C33 and inductor L31 are provided connected in series between transformer T1 and input terminal 1, and the connection point between capacitor C33 and inductor L31 is connected to the prescribed potential point by way of capacitor C31 and resistor R31 connected in series. The connection point between capacitor C33 and inductor L31 is connected to the prescribed potential point by way of capacitor C32.

On the output side of transformer T2, inductor L32 and capacitor C39 are provided connected in a series between transformer T2 and output terminal 2, and the connection point between inductor L32 and capacitor C39 is connected to a prescribed potential point by way of capacitor C38.

The source of FET Q11 of amplifying circuit 12 is connected to the source of FET Q21 of amplifying circuit 13 by way of resistor R41, and the gate of FET Q11 is coupled to the gate of FET Q21 by way of resistors R39 and R40 connected in series. Resistors R33 and R34 are inserted in series between transformer T1 and the midpoint of resistors R39 and R40. Power source voltage $V_{dd}$ is supplied to the connection point between resistor R33 and resistor R34. The connection point between resistor R33 and transformer T1 is connected to a prescribed potential point by way of resistor R32 and thermistors Rt31 and Rt32 provided in a series, and the midpoint of resistors R39 and R40 is connected to a prescribed potential point by way of resistor R35.

The source of FET Q12 is connected to a prescribed potential point by way of resistor R36, the source of FET Q22 is connected to a prescribed potential point by way of resistor R38, and the sources of these FET Q12 and Q22 are interconnected via resistor R37. Resistor R16, which is the gate resistance of FET Q13, and resistor R26, which is the gate resistance of FET Q23, are interconnected at point A, and resistors R42 and R43 are provided in series between point A and transformer T2. Resistor R44 and capacitor C40 are provided in parallel between a prescribed potential point and the connection point between resistor R42 and resistor R43. Power supply voltage $V_{dd}$ is supplied to the connection point between resistor R42 and transformer T2, and capacitor C36 is provided between this connection point and a prescribed potential point.

In this case, thermistors Rt11, Rt21 and Rt31 are thermosensitive resistance elements in which resistance changes with a negative temperature characteristic according to the ambient temperature, and thermistors Rt12, Rt13, Rt22, Rt23 and Rt32 are thermo-sensitive resistance elements in which resistance changes with a positive temperature characteristic according to the ambient temperature.

In this semiconductor circuit, resistor R43 having a resistance of 10~100 Ω is provided between point A and resistor R42, and capacitor C40 is provided between a prescribed potential point and the connection point between resistor R42 and resistor R43, the circuit constants of these elements being set to the termination conditions. Therefore, the potential of point A is 0 V from the standpoint of an AC signal, and point A serves as an imaginary ground point which can be seen as a grounded state. Since the location of point A is at the neutral point of the push-pull circuit made up of amplifying circuits 12 and 13, the ideal operation of amplifying circuits 12 and 13 is achieved and the even-order distortion (chiefly second-order distortion) component in the output of the push-pull circuit is canceled.

In the event of fluctuation in potential at point A in this configuration, the fluctuation in potential is absorbed by resistor R43, and the standing wave produced by such fluctuation in potential is not generated. Deterioration such as even-order distortion (chiefly CSO distortion) that originates in the standing wave can therefore be prevented.

The absence of oscillation in potential at point A is equivalent to forcible grounding of point A from the standpoint of an AC signal. This has the effect of forcibly maintaining the balance between amplifying circuits 12 and 13, correcting the inherent unbalance factors included in the circuit, and therefore, further preventing the deterioration of even-order distortion (principally CSO).

Thermistor Rt31 having a negative temperature characteristic and thermistor Rt32 having a positive temperature characteristic are combined as the resistance which controls the gate potentials of FETs Q11 and Q12 in a semiconductor circuit configured according to the foregoing description, and the current that flows through the circuit is therefore at a minimum at a predetermined reference temperature, the current flowing through the circuit increasing as the temperature rises above or falls below the reference temperature. In this case, the current flowing through the circuit is the drain current of FETs Q11 and Q12.

As a result, the distortion decreases as the temperature rises above or falls below the reference temperature, whereby distortion is compensated when the ambient temperature changes.

In this semiconductor circuit, moreover, thermistors Rt11 and Rt12 having a negative temperature characteristic are provided as the gate resistance of FETs Q11 and Q21, respectively. As a result, fluctuation in the gain characteristic-ambient temperature relation of the gain slope generated by the resonant circuit made up of inductor L12 and capacitor C16 within amplifying circuit 12 is canceled by fluctuation in the Q factor (the Quality factor) with respect to the ambient temperature in the circuit made up of capacitor C13, thermistor Rt11, and inductor L13. The slope characteristic of the gain slope outputted from amplifying circuit 12 is therefore uniform even in the event of changes in the ambient temperature. Similarly, the slope characteristic of the gain slope outputted from amplifying circuit 13 is also uniform despite changes in the ambient temperature.

Here, inductor L12 and capacitor C16 as well as inductor L23 and capacitor C26 that constitute resonant circuits that generate the gain slope are each provided outside the feedback loops. Changes in impedance are thus generated only on the output side, and impedance problems can be easily corrected.

While preferred embodiments of the present invention have been described using specific terms, such description is for illustrative purposes only, and it is to be understood that changes and variations may be made without departing from the spirit or scope of the following claims.

What is claimed is:

1. A semiconductor circuit comprising:
   a divider which divides an input signal into two signals of differing phase;
   first and second amplifying circuits which respectively amplify the signals divided by said divider;
   a combiner which combines the two signals amplified by said first and second amplifying circuits and outputs a result signal;
   an imaginary ground point which is a node between said first amplifying circuit and said second amplifying circuit having an AC potential essentially of 0 V; and
   a termination circuit provided between said imaginary ground point and ground that absorbs fluctuation in said AC potential generated at said imaginary ground point.

2. A semiconductor circuit according to claim 1, wherein said semiconductor circuit is a push-pull amplifying circuit, and wherein the two signals of differing phase have a mutual phase difference of 180 degrees, and wherein said divider distributes the two signals to said first amplifying circuit and said second amplifying circuit, respectively.

3. A semiconductor circuit according to claim 1 wherein said termination circuit consists of a resistor and a capacitor connected in series.

4. A semiconductor circuit according to claim 3 wherein resistance of said resistor is greater than or equal to 10 Ω and less than or equal to 100 Ω.

5. A semiconductor circuit according to claim 2 wherein said termination circuit consists of a resistor and a capacitor connected in series.

6. A semiconductor circuit according to claim 5 wherein resistance of said resistor is greater than or equal to 10 Ω and less than or equal to 100 Ω.

7. A semiconductor circuit according to claim 2 wherein each of said amplifying circuits comprises:
   a first transistor operating as an emitter grounding circuit; and
   a second transistor operating as a base grounding circuit and amplifying an output of said first transistor, a base of said second transistor connected to said imaginary ground point by way of a base resistance.

8. A semiconductor circuit according to claim 2 wherein each of said amplifying circuits comprises:
   a first FET (field effect transistor) operating as a source grounding circuit; and
   a second FET operating as a gate grounding circuit and amplifying an output of said first FET, a gate of said second FET connected to said imaginary ground point by way of a gate resistance.

9. A semiconductor circuit according to claim 2 wherein each of said amplifying circuits is provided with a feedback loop, a plurality of resistance elements, and FETs (field effect transistors) connected in multiple stages.

10. A semiconductor circuit according to claim 9 wherein a gate of at least one FET of said FETs connected in multiple stages is connected to said imaginary ground point by way of a gate resistance.

11. A semiconductor circuit according to claim 10, wherein said gate resistance comprises a plurality of thermistors.

* * * * *